(12) United States Patent
Okazawa et al.

(10) Patent No.: US 7,226,807 B2
(45) Date of Patent: Jun. 5, 2007

(54) METHOD OF PRODUCTION OF CIRCUIT BOARD UTILIZING ELECTROPLATING

(75) Inventors: Hideyasu Okazawa, Nagano (JP); Yoshiki Takeda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/396,203

(22) Filed: Mar. 30, 2006

(65) Prior Publication Data

US 2006/0223223 A1    Oct. 5, 2006

(30) Foreign Application Priority Data

Apr. 1, 2005   (JP)   .............................. 2005-106252

(51) Int. Cl.
*H01L 21/00*   (2006.01)
*H01L 23/495*  (2006.01)

(52) U.S. Cl. ......................................... 438/106; 29/852
(58) Field of Classification Search ................... 29/852
See application file for complete search history.

(56) References Cited

U.S. PATENT DOCUMENTS

| | | | | |
|---|---|---|---|---|
| 6,852,625 | B2 * | 2/2005 | Shin et al. ................... | 438/678 |
| 2005/0039948 | A1 * | 2/2005 | Asai et al. ................... | 174/262 |
| 2005/0121229 | A1 * | 6/2005 | Takai et al. .................. | 174/261 |

FOREIGN PATENT DOCUMENTS

| | | |
|---|---|---|
| JP | 2000-114412 | 4/2000 |
| JP | 2000114412 | * 4/2000 |

* cited by examiner

*Primary Examiner*—W. David Coleman
*Assistant Examiner*—Jae Lee
(74) *Attorney, Agent, or Firm*—Morgan & Finnegan LLP

(57) ABSTRACT

A method of production of a circuit board utilizing electroplating which prevents signal reflection and noise due to unnecessary parts in the circuit patterns when electroplating to form circuit patterns on the board to thereby improve the electrical properties and realize higher density layout of the circuit patterns, including the steps of forming a first electroless plating layer and an overlying first plating resist on a metal foil-clad insulating board, feeding power to the first electroless plating layer to form a first electroplating layer over the first electroless plating layer in resist openings; removing the first plating resist; removing the exposed first electroless plating layer and metal foil to expose the insulating board; forming a second electroless plating layer over the exposed parts of the board and the circuit patterns; forming a second plating resist over that; removing the second electroless plating layer at the resist openings; feeding power to the second electroless plating layer under the second plating resist to form a second electroplating layer over the circuit patterns in the resist openings; removing the second plating resist; and removing the exposed second electroless plating layer.

16 Claims, 8 Drawing Sheets

METHOD OF PRODUCTION OF CIRCUIT BOARD UTILIZING ELECTROPLATING

BACKGROUND OF THE INVENTION

1. Field of the Invention

The present invention relates to a method of production of a circuit board used for a semiconductor device etc., more particularly relates to a method of production of a circuit board not requiring power feed plating interconnects when producing a circuit board utilizing electroplating.

2. Description of the Related Art

In the past, when producing circuit boards used for semiconductor devices, for example, a large board 1 comprised of a glass prepreg or other resin as shown in FIG. 1A was prepared, this large board 1 was formed with circuit patterns 5 corresponding to a plurality of circuit boards 3 in a matrix, then this was cut along predetermined cutting lines 7 so as to obtain the individual circuit boards 3.

In particular, when using the subtractive method (tenting method) to form circuit patterns on the large board 1, since the bonding pads and other main parts of the circuit patterns 5 are electroplated for nickel plating or gold plating, power feed plating interconnects 9 for short-circuiting between circuit patterns are provided outside of the circuit boards 3 obtained by the cutting. Note that FIG. 1B shows enlarged parts of the circuit patterns 5 and plating interconnects 9 shown in FIG. 1A, wherein 11 shows bonding pads and 13 shows through holes.

When electroplating, the large board 1 is immersed in a plating solution (not shown) and plating interconnects 9 at the outer circumference of the large board 1 are connected to plating electrodes (not shown) so as to feed power to the circuit patterns 5 and electroplate the necessary locations of the circuit patterns 5 with nickel or gold.

After the electroplating, the large board 1 is cut at the inside parts of the plating interconnects 9 (parts along cutting lines 7 shown by broken lines) to obtain the individual circuit boards 3. For this reason, the circuit patterns 5 of the circuit boards 3 have parts 15 required only for connection to the plating interconnects 9 and not required for transmission of electric signals etc. from the through holes 13 to the outer edges of the circuit boards 3.

As such a circuit board 3, there is one used for a semiconductor device called a BGA (Ball Grid Array). In FIGS. 2A to 2K, a method of production of a circuit board obtained by the conventional subtractive method, in particular a circuit board 3 used for a BGA, will be explained step by step. Further, a BGA using a circuit board 3 produced in this way is shown in FIG. 3A. Note that the drawings of FIGS. 2A to 2K show a method of production of a circuit pattern of the sectional part shown by X in FIG. 3A (circuit pattern formation method).

In FIG. 2A, first a large double-sided copper-clad multilayer board 10 comprised of a resin board (glass prepreg) 1 clad with copper foil 17, 17 on its two surfaces is prepared. This double-sided copper-clad multilayer board 10 is formed on its surfaces with a plurality of circuit boards 3 as shown in FIG. 1A.

In FIG. 2B, a drill (not shown) is used to form through holes 13 at required locations.

In FIG. 2C, the entire surface including the inside walls of the through holes 13 is given a copper or other electroless plating 19.

In FIG. 2D, power is fed from the electroless plating layer 19 to give the electroless plating layer 19 a copper or other electroplating 21. Due to this, a plating thickness required for formation of the circuit patterns is formed.

In FIG. 2E, the electroplating layer 21 is coated with a film-like etching resist called a "dry film resist". This is exposed and developed to form resist patterns 23 corresponding to predetermined circuit patterns.

In FIG. 2F, the resist patterns 23 are used as masks for etching so as to remove parts of the copper electroplating layer 21, copper electroless plating layer 19, and copper foil 17 exposed from the resist patterns 23 and unnecessary for formation of circuit patterns and thereby form the circuit patterns 5.

In FIG. 2G, the resist patterns 23 are removed. Due to this, the circuit patterns 5 are exposed. The circuit patterns 5 are connected through connection parts 5c to the plating interconnects 9 formed simultaneously with the circuit patterns 5 and are short-circuited from each other as shown in FIGS. 1A and 1B. Note that these plating interconnects 9, as shown in FIGS. 1A and 1B, are formed on the large resin board 1 in frame shapes outside of cutting lines 7 for obtaining the plurality of circuit boards 3 and before cutting are connected to all of the circuit patterns 5 of the circuit boards 3.

Next, in FIG. 2H, a solder resist is coated by printing and exposed and developed to form solder resist patterns 25. At this time, the solder resist patterns 25 are formed so that the bonding pads 11 of the circuit patterns 5, the external connection pads (parts for connection with solder balls) 31, and other required locations are exposed.

In FIG. 2I, power is fed from the plating interconnects 9 (FIGS. 1A and 1B) to give the wire bonding pads 11 and external connection pads 31 nickel electroplating 27, then gold electroplating 29. Note that FIG. 2J is a view seen from above FIG. 3B (however, solder resist patterns 25 not shown). As illustrated, at the time of nickel/gold (Ni/Au) electroplating, the circuit patterns 5 are short-circuited by the plating interconnects 9.

In FIG. 2K, the large board 1 is cut along the cutting lines 7 shown by FIGS. 2I and 2J to obtain the individual circuit boards 3.

After this, a semiconductor chip 33 is mounted on each of the circuit boards 3, bonding wires 35 are used to connect the semiconductor chip 33 and wire bonding pads 11, a resin 37 is used to seal them, then solder balls 39 are joined to thereby obtain a semiconductor device (BGA) as shown in FIG. 3A. FIG. 3B is a view of the part of the circuit board shown by X in FIG. 3A seen from above (state with sealing resin 37 and solder resist patterns 25 removed). The semiconductor chip 33 may otherwise be mounted on each of the circuit boards 3 by flip chip bonding, where the circuit boards 3 have pads to be connected to bumps of the semiconductor chip 33. The circuit board 3 may be any of BGA (ball grid array), LGA (lad grid array) and PGA (pin grid array). An LGA has pads functioning as an external connection terminal in themselves. A PGA has pins which, instead of solder balls, are connected to external connection pads.

If using a circuit board 3 shown in FIG. 3A produced by the above conventional subtractive method, as shown in FIG. 3B, the circuit pattern 5 is formed with unnecessary parts (parts 5c connecting to plating interconnects) extending from the parts of the through holes 13 to the outer edges 7a of the cut circuit board 3. These unnecessary parts 5c cause signal reflection and noise and degrade the electrical properties of the semiconductor device. Further, if providing such plating interconnects 9 and connecting parts 5c, the layout of the circuit patterns 5 is restricted by the amount of the plating interconnects 9 and connecting parts 5c, so higher density of the circuit patterns 5 is inhibited.

Note that as prior art relating to the present invention, there is Japanese Patent Publication (A) No. 2000-114412. This discloses improving the bonding between the circuit patterns and board, enabling finer circuit patterns, and improving the bonding between the solder resist and conductor parts by using a copper layer formed on the board surface as a power feed layer for electroplating and by etching the copper layer using resist patterns as masks so as to form circuit patterns.

SUMMARY OF THE INVENTION

As stated above, with a circuit board produced by the above conventional subtractive method, unnecessary parts are formed in the circuit patterns due to the need to feed power for electroplating. These unnecessary parts cause signal reflection and noise and thereby degrade the electrical properties of the semiconductor device or limit the layout of the circuit patterns and thereby inhibit higher density of the circuit patterns.

Accordingly, an object of the present invention is to provide method of production of a circuit board utilizing electroplating which does not form unnecessary parts in the circuit patterns even if using electroplating to form circuit patterns on the board and thereby does not cause degradation of the electrical properties of the semiconductor device due to the resultant signal reflection or noise and enables higher density layout of the circuit patterns.

To achieve this object, according to the present invention, there is provided a method of production of a circuit board utilizing electroplating comprising the steps of forming through holes in an insulating board clad on its surface with a metal foil, forming a first electroless plating layer on the metal foil and at the inside walls of the through holes, forming first plating resist patterns on the first electroless plating layer so as to expose only first predetermined locations, using the first electroless plating layer as a power feed layer for electroplating to form a first electroplating layer on the first electroless plating layer exposed at the first predetermined locations to form circuit patterns, removing the first plating resist patterns to expose the underlying first electroless plating layer, removing the exposed first electroless plating layer and underlying metal foil to expose the surface of the insulating board, forming a second electroless plating layer on the surface of the exposed insulating board and on the circuit patterns including the insides of the through holes, forming second plating resist patterns so as to expose only second predetermined locations of the second electroless plating layer and the circuit patterns, removing the second electroless plating layer exposed at the second predetermined locations, using the second electroless plating layer under the second plating resist pattern as a power feed layer for electroplating to form a second electroplating layer on the circuit patterns exposed at the second predetermined locations, removing the second plating resist patterns to expose the underlying second electroless plating layer, and removing the exposed second electroless plating layer.

Typically, the metal foil, the first electroless plating layer, and the first electroplating layer are copper.

Typically, the second electroplating layer is comprised of a nickel electroplating layer on the exposed circuit patterns and an overlying gold electroplating layer.

Typically, the step of forming the first plating resist patterns includes a step of coating the first electroless plating layer with a plating resist and a step of exposing and developing it, while the step of forming the second plating resist patterns include a step of coating the board including the second electroless plating layer and the circuit patterns with a plating resist and a step of exposing and developing it.

Typically, the method further comprises a step for forming solder resist patterns including a step of forming a solder resist layer on the circuit patterns and a step of exposing and developing the solder resist layer so as to expose the second electroplating layer of the circuit patterns.

Typically, the circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to the cutting lines at the edges of the individual circuit boards.

According to the method of production of a circuit board utilizing electroplating of the present invention, unlike a circuit board produced by the conventional method of production, plating interconnects are no longer required. In addition, there are no "unnecessary parts" such as connection parts for connecting the circuit patterns to the plating interconnects. Therefore, there is no longer signal reflection or noise caused by such "unnecessary parts" or consequent degradation of electrical properties of the semiconductor device. Further, since there are no longer any "unnecessary parts", the degree of freedom of layout of the circuit patterns is increased and higher density layout of circuit patterns becomes possible

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENT

Below, preferred embodiments of the present invention will be explained in detail with reference to the attached drawings.

According to the present invention, there is no need for plating interconnects for electroplating, so the above conventional problem does not arise. Note that in the following explanation of the preferred embodiments, as the resin board 1, a multilayer circuit board formed inside it with a plurality of interconnect layers may also be used. Further, the circuit patterns may be formed on both surfaces of the resin board 1 or formed on only one surface.

First Embodiment

Below, a first embodiment of the present invention will be explained with reference to FIGS. 4A to 4N. In the following explanation, the dimensions of the different parts are only representative examples. There is no need to limit the invention to these dimensions.

Figure 1A:
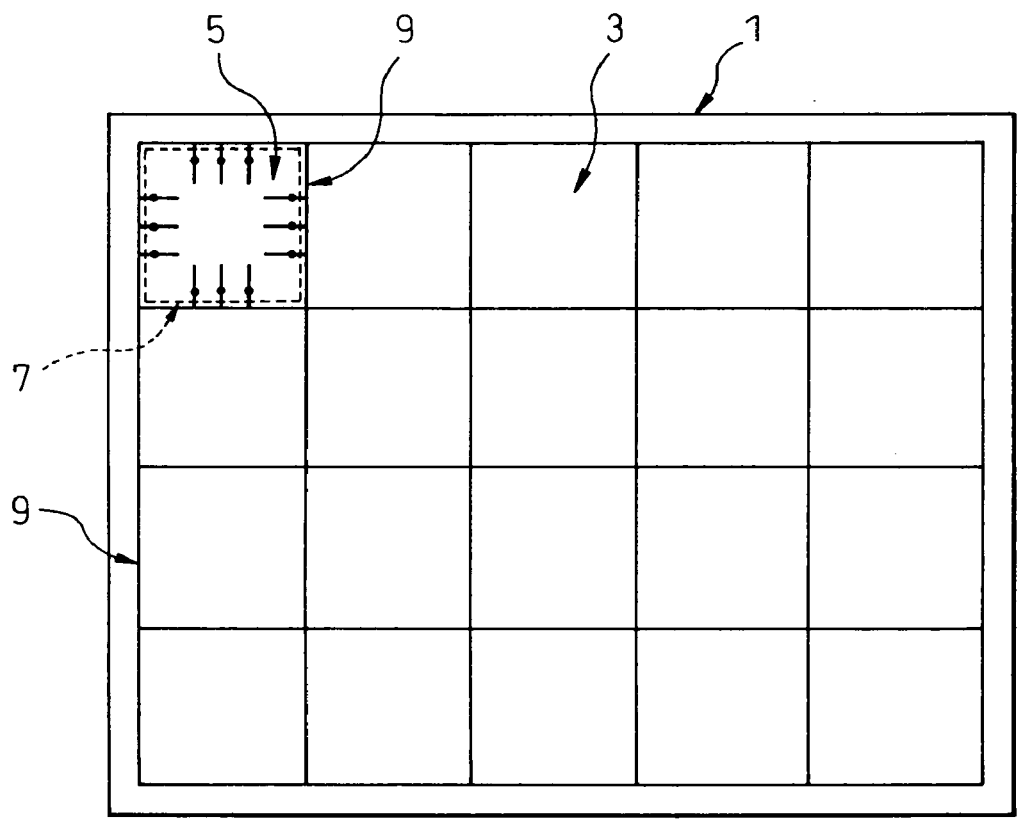
FIGS. 1A and 1B are a plan view and partially enlarged plan view showing a large board for forming a plurality of circuit boards according to a conventional method of production.
Figure 1B:
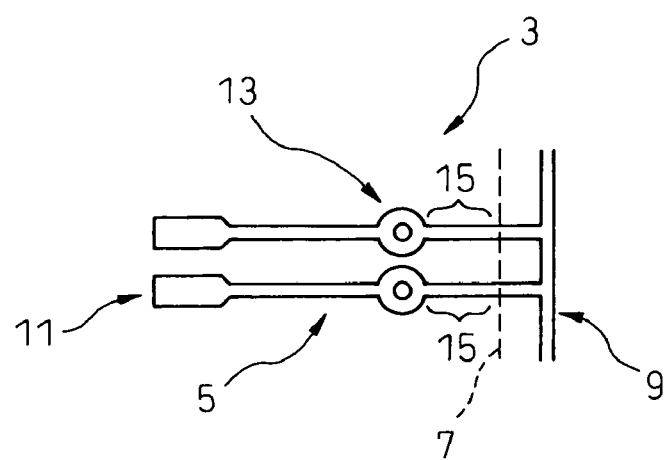
Figure 2A:
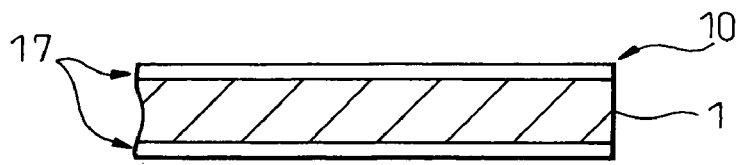
FIGS. 2A to 2K are sectional views of steps in the production of a conventional circuit board by the subtractive method.
Figure 2B:
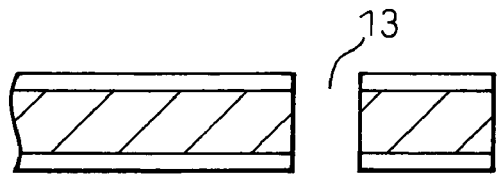
Figure 2C:
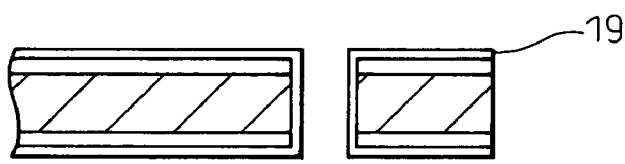
Figure 2D:
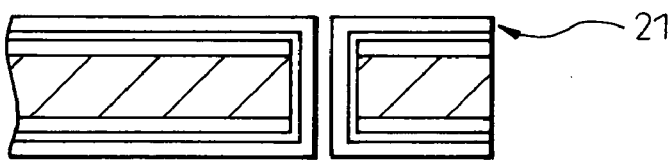
Figure 2E:
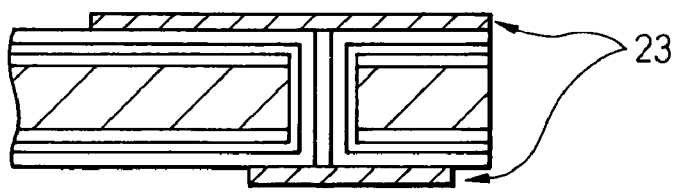
Figure 2F:
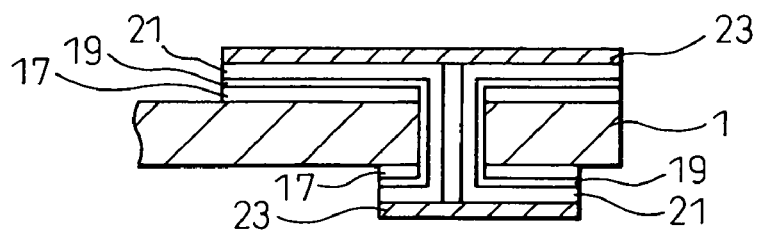
Figure 2G:
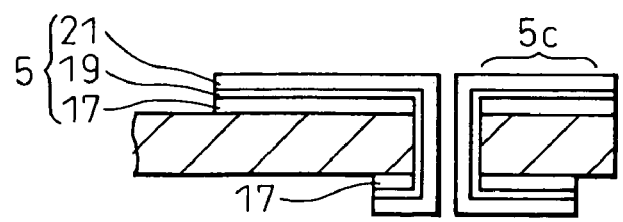
Figure 2H:
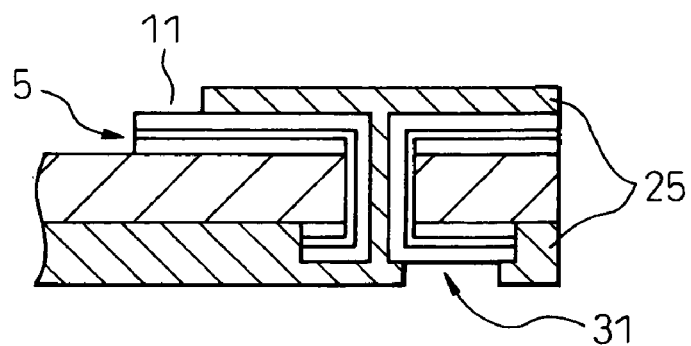
Figure 2I:
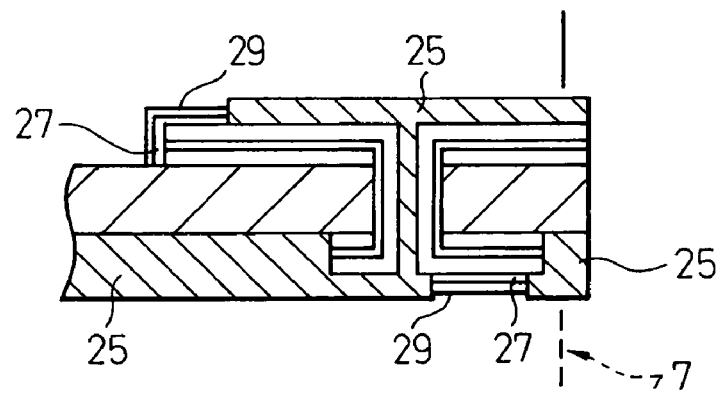
Figure 2J:
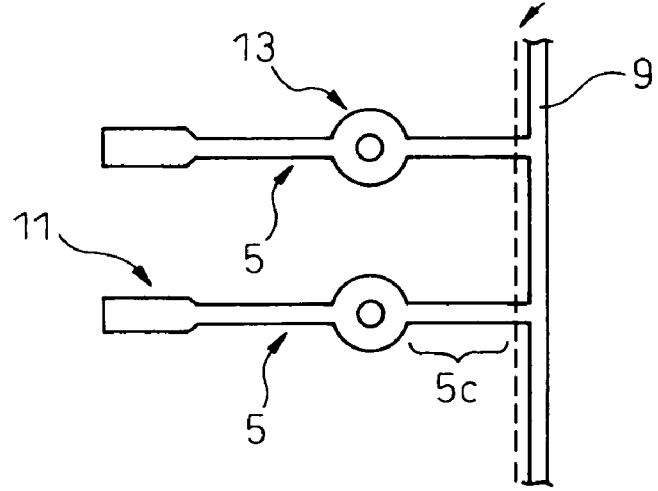
Figure 2K:
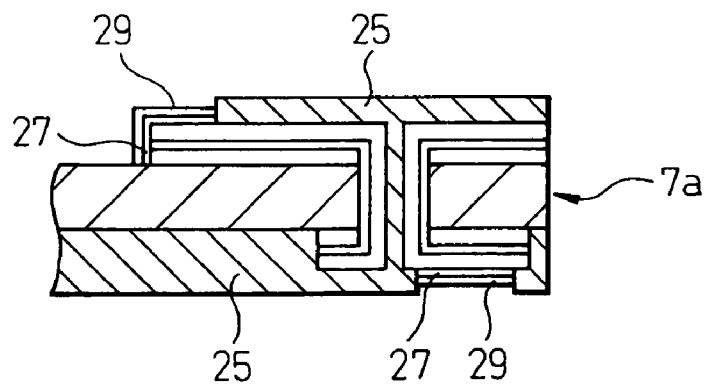
Figure 3A:
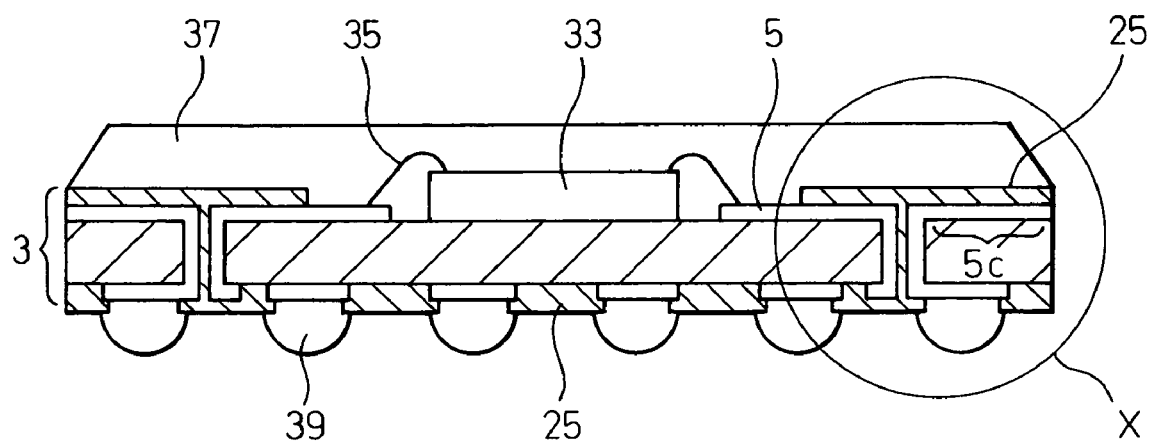
FIGS. 3A and 3B are a sectional view and a partially enlarged plan view showing a semiconductor device obtained by the conventional method of production.
Figure 3B:
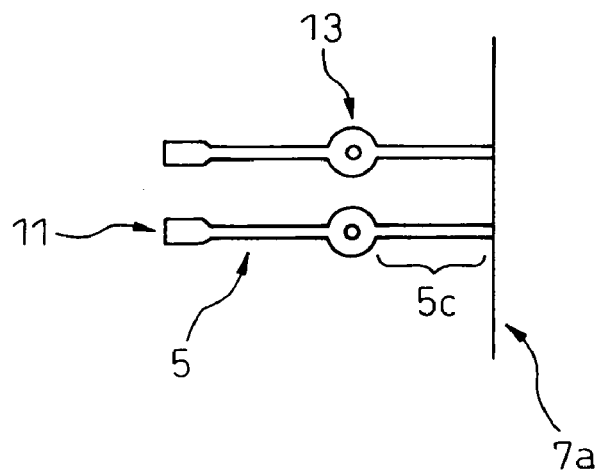
Figure 4A:
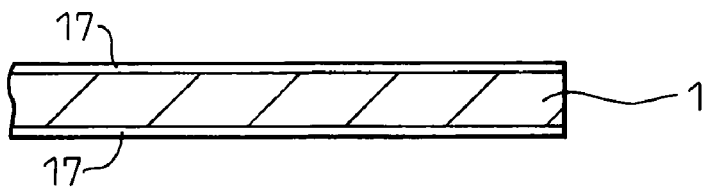
FIGS. 4A to 4N are sectional views of steps in the production of a circuit board according to an embodiment of the present invention.

First, as shown in FIG. 4A, a double-sided copper foil 17 (thickness 1 to 3 μm)—clad glass cloth—containing epoxy resin board 1 (thickness 0.03 mm or more) is prepared.

Figure 4B:
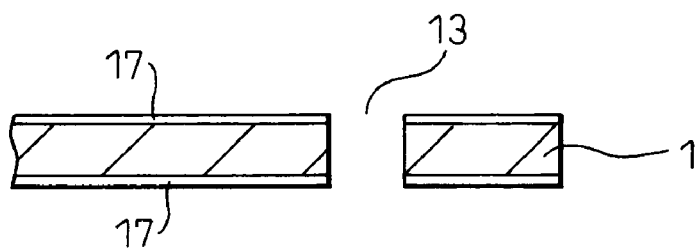

Next, as shown in FIG. 4B, a drill is used to form through holes 13 (opening diameter 35 to 350 μm) in the board 1.

Figure 4C:
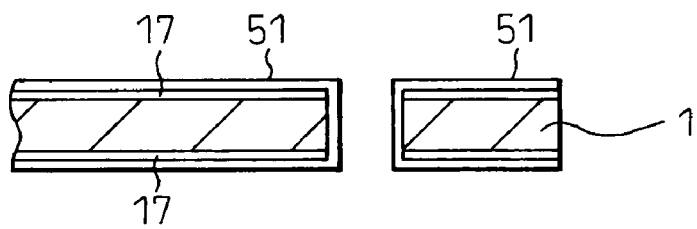

Next, as shown in FIG. 4C, a first copper electroless plating layer 51 (thickness 0.01 μm or more) is formed on the copper foil 17 and in the through holes 13. The first copper electroless plating layer 51 later forms the power feed layer for the copper electroplating. 0.01 μm or so of thickness is sufficient for functioning as a power feed layer. The first copper electroless plating layer 51 may have a maximum thickness of about 0.1 μm.

Figure 4D:
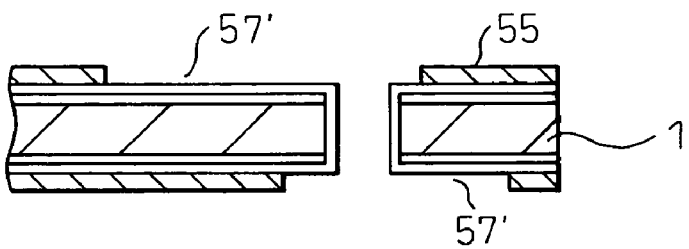

Next, as shown in FIG. 4D, the first copper electroless plating layer 51 is formed with first plating resist patterns 55 so that only first predetermined locations as constituted by circuit pattern forming locations 57' are exposed.

Figure 4E:
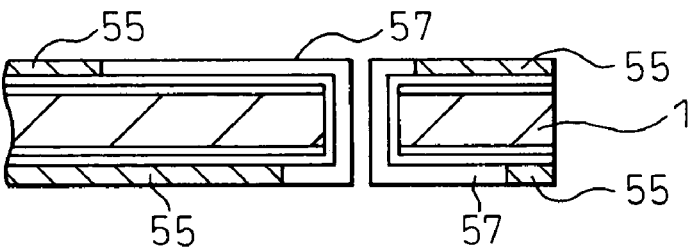

Next, as shown in FIG. 4E, the first copper electroless plating layer 51 is used as a power feed layer for copper electroplating to form a first copper electroplating layer 57 forming the majority of the thickness of the circuit patterns on the first copper electroless plating layer 51 exposed at the first predetermined locations 57'. In this example, the through holes 13 are used to connect the circuit patterns on the two sides of the board. 5 μm or so is sufficient as the thickness of the first copper electroplating layer 57. However, the thickness may be as great as about 20–30 μm in accordance with the circuit pattern design.

Figure 4F:
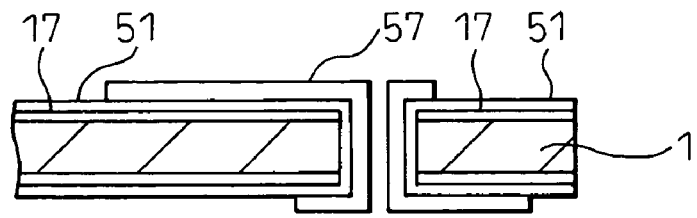

Next, as shown in FIG. 4F, the first plating resist patterns 55 are peeled off to expose the underlying first copper electroless plating layer 51.

Figure 4G:
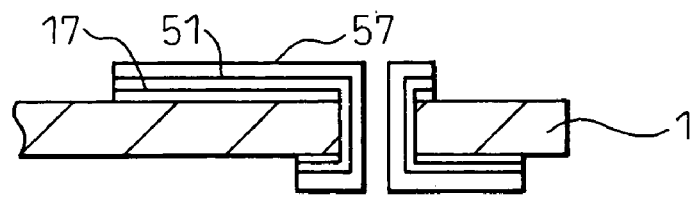

Next, as shown in FIG. 4G, flush etching is performed to remove the exposed parts of the first copper electroless plating layer 51 and the underlying copper foil 17.

The first electrolytic copper plating layer 57 (thickness 5 μm or more) is thicker compared with the first copper electroless plating layer 51 (thickness 0.01 μm or more) and the copper foil 17 (thickness 1 to 3 μm), so even if some of the surface is removed at the time of flush etching, a thickness sufficient for the circuit patterns is maintained and there is therefore no problem in use.

Due to this, circuit patterns comprised of the three layers of the copper foil 17, first copper electroless plating layer 51, and first copper electroplating layer 57 stacked over each other (thickness 5 μm or more) are completed (below, also shown as the "circuit patterns 57"). At the areas other than the circuit patterns, the surface of the resin board 1 is exposed.

Figure 4H:
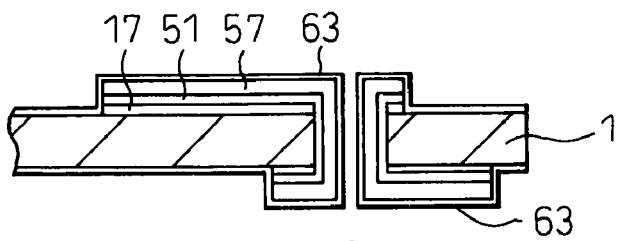

Next, as shown in FIG. 4H, the exposed surface of the resin board 1 the circuit patterns 57 including the insides of the through holes 13 are formed with a second copper electroless plating layer 63 (thickness 0.01 μm or more). The second copper electroless plating layer 63 later forms the power feed layer for the nickel electroplating and gold electroplating for forming the pads. 0.01 μm or so of thickness is sufficient for functioning as a power feed layer. The second copper electroless plating layer 63 may have a maximum thickness of about 0.1 μm.

Figure 4I:
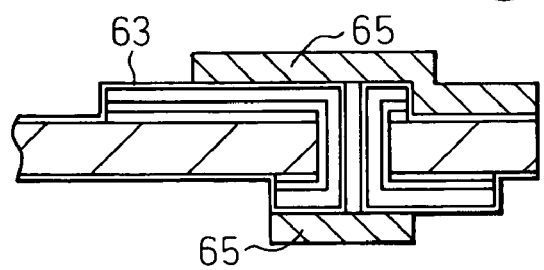

Next, as shown in FIG. 4I, second plating resist patterns 65 are formed so that only second predetermined locations (locations of the second copper electroless plating layer 63 where pads of the circuit patterns 57 are scheduled to be formed and locations of the second copper electroless plating layer 63 on the surface of the resin board 1 scheduled to be removed) are exposed. The right end in the figure shows the end of the board. At the top surface of this part, the second plating resist patterns 65 cover the second copper electroless plating layer 63.

Figure 4J:
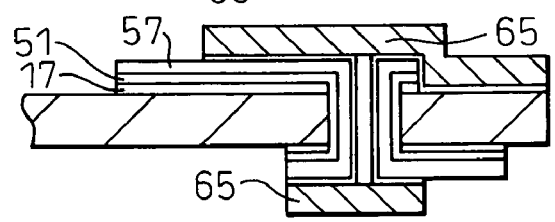

Next, as shown in FIG. 4J, flush etching is performed to remove the exposed parts of the second copper electroless plating layer 63 and expose the underlying circuit patterns 57 and surface of the resin board 1. The second electroless plating layer 63 electrically short-circuits the plurality of circuit patterns 57 and forms the electroplating power feed layer. At the ends of the circuit patterns 57, the ends of the underlying first copper electroless plating layer 51 and the copper foil 17 are also exposed.

Figure 4K:
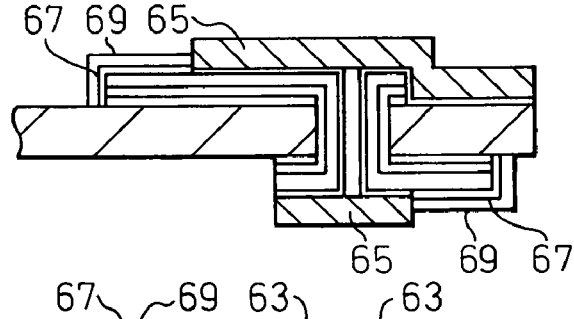

Next, as shown in FIG. 4K, the second copper electroless plating layer 63 is used as the power feed layer and the second plating resist patterns 65 are used as masks for successive nickel electroplating and gold electroplating so as to form over the exposed circuit patterns 57 a nickel electroplating layer 67 (thickness 1 μm or more) and an overlying gold electroplating layer 69 (thickness 0.1 μm or more) constituting a second electroplating layer. The nickel electroplating layer 67 and gold electroplating layer 69 also cover the ends of the circuit patterns (ends of 57+51+17). The gold electroplating layer 69 may be replaced by an electroplating layer of palladium or other noble metals. The second electroplating layer may otherwise be constituted by forming a nickel electroplating layer, a palladium electroplating layer and a gold electroplating layer in that order.

Figure 4L:
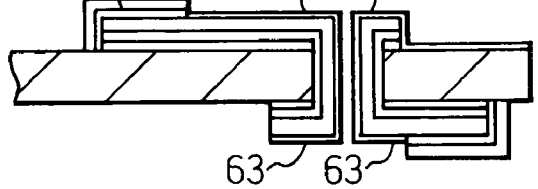

Next, as shown in FIG. 4L, the second plating resist pattern 65 is peeled off to expose the underlying second copper electroless plating layer 63.

Figure 4M:
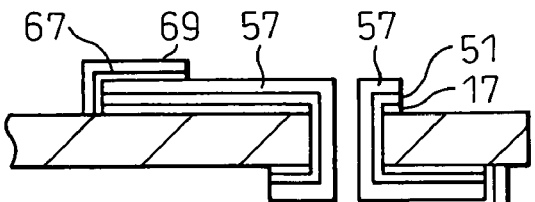

Next, as shown in FIG. 4M, flush-etching is performed to remove the exposed second copper electroless plating layer 63.

Figure 4N:
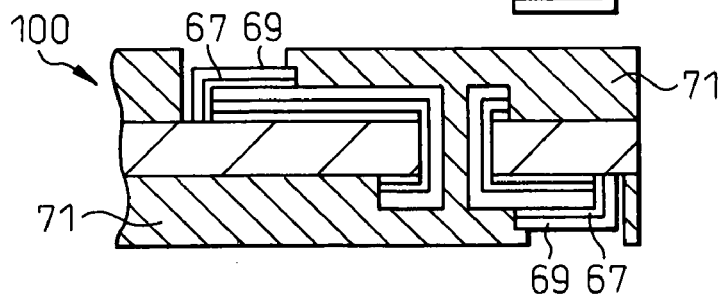

Finally, as shown in FIG. 4N, a solder resist is coated by printing and exposed and developed to form solder resist patterns 71. The solder resist patterns 71 are formed so as to expose the parts of the nickel/gold electroplating layers 67/69 (second electroplating layer) forming the pad parts of the circuit patterns 57.

From the above, the circuit patterns 57 on the two sides of the resin board 1 are covered by the solder resist patterns 71 other than at the pad parts 69 and 67. The two sides of the circuit patterns 57 are connected through the through holes 13 to complete the circuit board 100.

Note that the exposed parts of the copper foil 17 and first copper electroless plating layer 51 are removed once by flush etching at the step of FIG. 4F, then the second copper electroless plating layer 63 is formed again by the step of FIG. 4H for the following reason.

Not removing the copper foil 17 and first copper electroless plating layer 51 and using them as the power feed layer in the subsequent nickel electroplating and gold electroplating may also be considered.

Figure 5A:
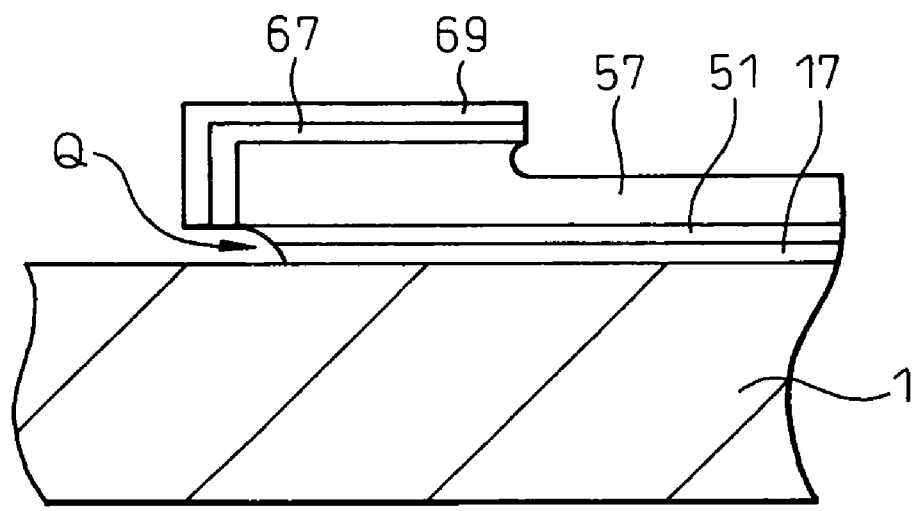
FIGS. 5A and 5B are sectional views in the length direction of the circuit patterns and the width direction of the circuit patterns showing undercut occurring at circuit patterns under nickel/gold pads when outside the method of the present invention.
Figure 5B:
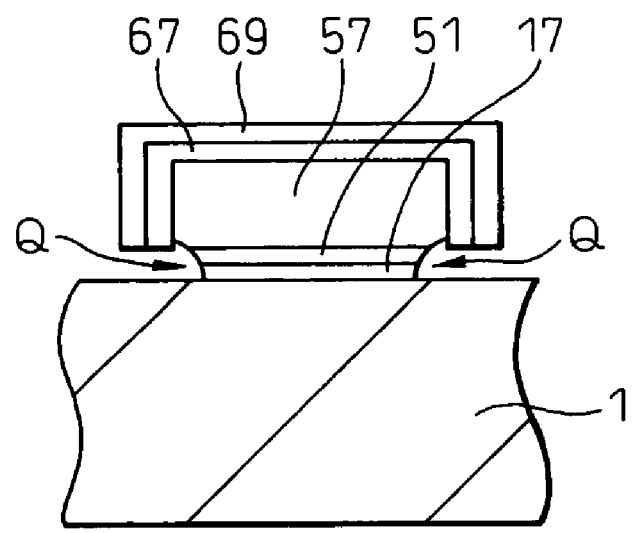

However, the copper foil 17 (1 to 3 μm) is considerably thicker than the copper electroless plating layer 51 or 63 (thickness 0.01 μm or more). For this reason, if using the copper foil 17 as the power feed layer for nickel electroplating and gold electroplating, the subsequent flush etching for removing the power feed layer (17+51) would take a long time. Both nickel and gold will not dissolve in a copper etching solution, so under etching will selectively occur under the copper electroplating layer forming the main parts of the circuit patterns at the edges of the nickel/gold plating layers. As shown in FIGS. 5A and 5B, undercut parts Q will be formed at the circuit patterns.

The nickel/gold plating layers 67/69 easily peel from these undercut parts Q. Further, the circuit patterns 57/51/17 become weak in bonding force with the board 1, so the circuit patterns 57/51/17 themselves also easily peel off.

To prevent such undercuts, in the present invention, the power feed layer for the nickel electroplating and gold electroplating is made thinner to enable easy removal by a short time of flush etching.

For this reason, the parts of the copper foil 17 and first copper electroless plating layer 51 exposed at the step of FIG. 4F are removed once at the step of FIG. 4G by flush etching. Due to this, the parts of the copper foil 17, which is far thicker than the electroless plating layer, used for the power feed layer are removed at this stage.

Further, at the step of FIG. 4H, a thin second copper electroless plating layer 63 is again formed and used as the power feed layer for nickel electroplating and gold electroplating. This second copper electroless plating layer 63 need only be formed to a thin 0.01 μm or so. Compared with the 1 to 3 μm thickness copper foil 17, it can be easily removed by a short time of flush etching. For this reason, while undercut parts Q will be caused in long duration flush etching for removing the thick power feed layer including the thick copper foil 17, such undercut parts Q will never occur with the method of the present invention.

Second Embodiment

The method of the present invention may also use a double-sided copper foil-clad multilayer board.

Figure 6A:
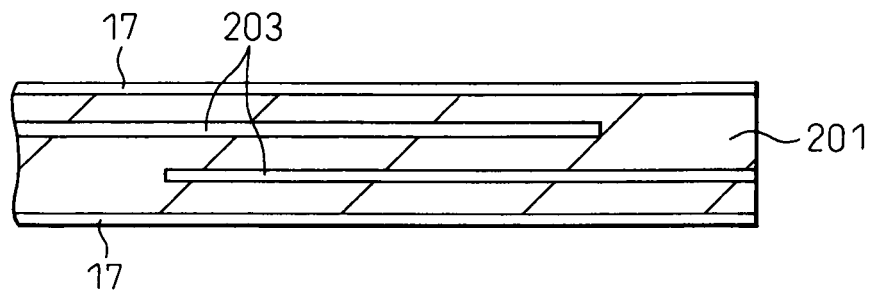
FIGS. 6A to 6D are sectional views showing steps in the production of a circuit board when applying the method of the present invention to a double-sided copper foil-clad board.

First, as shown in FIG. 6A, a double-sided copper foil-clad multilayer board 201 (thickness 80 to 500 μm or so) comprised of a glass cloth-containing epoxy resin board on the two surfaces of which copper foil 17 (thickness 1 to 3 μm) is clad and formed inside with circuit patterns 203 is prepared.

Figure 6B:
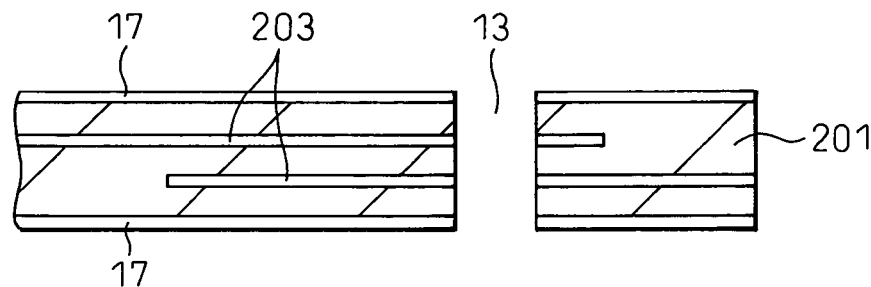

Next, as shown in FIG. 6B, this board 201, in the same way as the first embodiment, is formed with through holes 13 (opening diameter 35 to 350 μm or so).

Figure 6C:
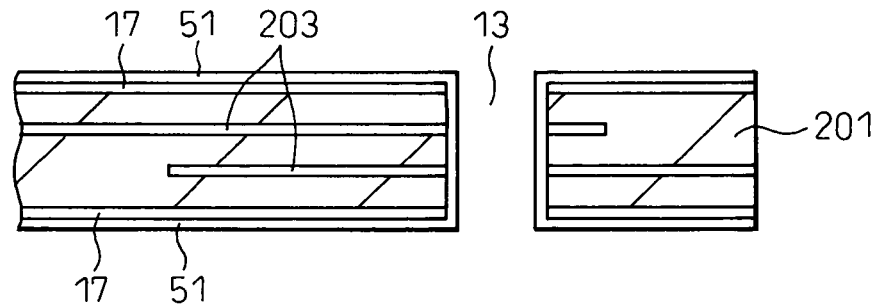

Next, as shown in FIG. 6C, in the same way as the first embodiment, the first copper electroless plating layer 51 (thickness 0.01 μm or more) is formed.

Figure 6D:
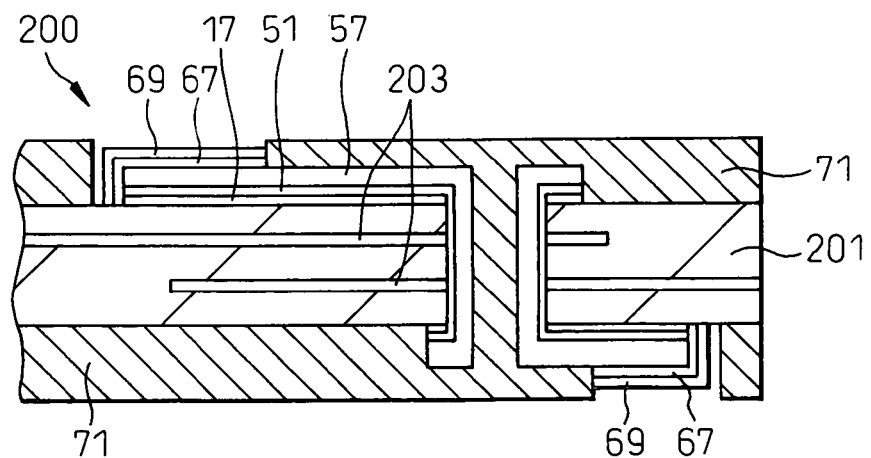

After this, processing is performed in the same way as the steps of the first embodiment shown in FIG. 4D to FIG. 4N, whereby the multilayer circuit board 200 shown in FIG. 6D is completed. This structure is similar to the structure of the first embodiment shown in FIG. 4N except for the provision of the circuit patterns 203 inside the board. Similar actions and effects of the invention are obtained as well.

Above, preferred embodiments of the present invention were explained with reference to the attached drawings, but the present invention is not limited to these embodiments. Various modes, modifications, corrections, etc. may be made within the scope of the claims.

As explained above, according to the present invention, even when forming interconnects patterns on a board utilizing electroplating, there are no unnecessary parts in the interconnect patterns, therefore, there is no longer signal reflection or noise caused by this or consequent degradation of electrical properties of the semiconductor device. Further, higher density layout of circuit patterns becomes possible Further, as an additional effect, since the entire process up to the patterning is performed first, it becomes possible to check the conductivity before plating.

The invention claimed is:

1. A method of production of a circuit board utilizing electroplating comprising the steps of:
   forming through holes in an insulating board clad on its surface with a metal foil,
   forming a first electroless plating layer on said metal foil and at the inside walls of said through holes,
   forming first plating resist patterns on said first electroless plating layer so as to expose only first predetermined locations,
   using said first electroless plating layer as a power feed layer for electroplating to form a first electroplating layer on the first electroless plating layer exposed at said first predetermined locations to form circuit patterns,
   removing said first plating resist patterns to expose the underlying first electroless plating layer,
   removing said exposed first electroless plating layer and the underlying metal foil to expose the surface of said insulating board,
   forming a second electroless plating layer on the surface of said exposed insulating board and on said circuit patterns including the insides of said through holes,
   forming second plating resist patterns so as to expose only second predetermined locations of said second electroless plating layer and said circuit patterns,
   removing said second electroless plating layer exposed at said second predetermined locations,
   using said second electroless plating layer under said second plating resist pattern as a power feed layer for electroplating to form a second electroplating layer on said circuit patterns exposed at said second predetermined locations,
   removing said second plating resist patterns to expose the underlying second electroless plating layer, and
   removing said exposed second electroless plating layer.

2. A method of production of a circuit board as set forth in claim 1, wherein said metal foil, said first electroless plating layer, and said first electroplating layer are copper.

3. A method of production of a circuit board as set forth in claim 1, wherein said second electroplating layer is comprised of a nickel electroplating layer on said exposed circuit patterns and a gold electroplating layer on top of that.

4. A method of production of a circuit board as set forth in claim 1, wherein the step of forming said first plating resist patterns includes a step of coating said first electroless plating layer with a plating resist layer and a step of exposing and developing it, while the step of forming said second plating resist patterns includes a step of coating the board including said second electroless plating layer and said circuit patterns with a plating resist layer and a step of exposing and developing it.

5. A method of production of a circuit board as set forth in claim 1, further comprising a step of forming solder resist patterns including a step of forming a solder resist layer on said circuit patterns and a step of exposing and developing said solder resist layer so as to expose the second electroplating layer of said circuit patterns.

6. A method of production of a circuit board as set forth in claim 1, wherein said circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to said cutting lines at the edges of the individual circuit boards.

7. A method of production of a circuit board as set forth in claim 2, wherein said second electroplating layer is comprised of a nickel electroplating layer on said exposed circuit patterns and a gold electroplating layer on top of that.

8. A method of production of a circuit board as set forth in claim 2, wherein the step of forming said first plating resist patterns includes a step of coating said first electroless plating layer with a plating resist layer and a step of exposing and developing it, while the step of forming said second plating resist patterns includes a step of coating the board including said second electroless plating layer and said circuit patterns with a plating resist layer and a step of exposing and developing it.

9. A method of production of a circuit board as set forth in claim 3, wherein the step of forming said first plating resist patterns includes a step of coating said first electroless plating layer with a plating resist layer and a step of exposing and developing it, while the step of forming said second plating resist patterns includes a step of coating the board including said second electroless plating layer and said circuit patterns with a plating resist layer and a step of exposing and developing it.

10. A method of production of a circuit board as set forth in claim 2, further comprising a step of forming solder resist patterns including a step of forming a solder resist layer on said circuit patterns and a step of exposing and developing said solder resist layer so as to expose the second electroplating layer of said circuit patterns.

11. A method of production of a circuit board as set forth in claim 3, further comprising a step of forming solder resist patterns including a step of forming a solder resist layer on said circuit patterns and a step of exposing and developing said solder resist layer so as to expose the second electroplating layer of said circuit patterns.

12. A method of production of a circuit board as set forth in claim 4, further comprising a step of forming solder resist patterns including a step of forming a solder resist layer on said circuit patterns and a step of exposing and developing said solder resist layer so as to expose the second electroplating layer of said circuit patterns.

13. A method of production of a circuit board as set forth in claim 2, wherein said circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to said cutting lines at the edges of the individual circuit boards.

14. A method of production of a circuit board as set forth in claim 3, wherein said circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to said cutting lines at the edges of the individual circuit boards.

15. A method of production of a circuit board as set forth in claim 4, wherein said circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to said cutting lines at the edges of the individual circuit boards.

16. A method of production of a circuit board as set forth in claim 5, wherein said circuit board is one individually obtained by cutting a large sized board along predetermined cutting lines, the feed of power by the electroless plating layer in the electroplating step is performed by an electroless plating layer at the edges of the large sized board, and, in the step of forming circuit patterns, the circuit patterns are formed on the large sized board so as not to extend to said cutting lines at the edges of the individual circuit boards.

* * * * *